United States Patent
Yang et al.

(10) Patent No.: US 10,399,891 B2
(45) Date of Patent: Sep. 3, 2019

(54) WAVELENGTH CONVERSION GLASS, METHOD FOR PREPARING SAME, AND LIGHT EMITTING DEVICE COMPRISING SAME

(71) Applicant: PUKYONG NATIONAL UNIVERSITY INDUSTRY-UNIVERSITY COOPERATION FOUNDATION, Busan (KR)

(72) Inventors: Hyun Kyoung Yang, Busan (KR); Jung Sik Joo, Busan (KR)

(73) Assignee: Pukyong National University Industry-University Cooperation Foundation, Busan (KR)

( * ) Notice: Subject to any disclaimer, the term of this patent is extended or adjusted under 35 U.S.C. 154(b) by 0 days.

(21) Appl. No.: 15/779,613

(22) PCT Filed: Jan. 5, 2017

(86) PCT No.: PCT/KR2017/000160
§ 371 (c)(1),
(2) Date: May 29, 2018

(87) PCT Pub. No.: WO2017/142194
PCT Pub. Date: Aug. 24, 2017

(65) Prior Publication Data
US 2018/0370847 A1   Dec. 27, 2018

(30) Foreign Application Priority Data

Feb. 15, 2016   (KR) .................. 10-2016-0016890

(51) Int. Cl.
C03C 14/00   (2006.01)
C03C 3/12   (2006.01)
(Continued)

(52) U.S. Cl.
CPC ............ C03C 14/004 (2013.01); C03B 32/02 (2013.01); C03C 3/12 (2013.01); C03C 3/14 (2013.01);
(Continued)

(58) Field of Classification Search
CPC .... C03C 14/006; C03C 13/046; C03C 14/004
See application file for complete search history.

(56) References Cited

U.S. PATENT DOCUMENTS

2008/0035887 A1* 2/2008 Iwao et al. ............. C03C 3/068
252/301.4 F
2012/0220442 A1* 8/2012 Ogino .................... C03C 3/062
501/37

FOREIGN PATENT DOCUMENTS

JP   2007-123410   5/2007
JP   2008-019109   1/2008
(Continued)

OTHER PUBLICATIONS

International Search Report and Written Opinion issued in Corresponding International Patent Application No. PCT/KR2017/000160, dated Apr. 13, 2017. (English Translation).
(Continued)

Primary Examiner — Thomas L Dickey
(74) Attorney, Agent, or Firm — Norton Rose Fulbright US LLP

(57) ABSTRACT

The present disclosure provides a wavelength conversion glass, a method for manufacturing the wavelength conversion glass, and a light emitting device including the wavelength conversion glass. The wavelength conversion glass includes a $TeO_2$—$B_2O_3$—$ZnO$—$BaO$-based transparent glass containing tellurium dioxide ($TeO_2$), boric oxide ($B_2O_3$), zinc oxide ($ZnO$), and barium oxide ($BaO$); and phosphor micro-particles dispersed in the transparent glass.

5 Claims, 2 Drawing Sheets

(51) Int. Cl.
    *C03C 3/14*     (2006.01)
    *C03C 3/23*     (2006.01)
    *C03C 4/12*     (2006.01)
    *C09K 11/08*     (2006.01)
    *C09K 11/77*     (2006.01)
    *C03B 32/02*     (2006.01)
    *C09K 11/02*     (2006.01)
    *H01L 33/50*     (2010.01)
    *H01L 51/50*     (2006.01)
    *C03B 19/06*     (2006.01)

(52) U.S. Cl.
    CPC .......... *C03C 3/23* (2013.01); *C03C 4/12* (2013.01); *C09K 11/025* (2013.01); *C09K 11/08* (2013.01); *C09K 11/77* (2013.01); *C09K 11/7774* (2013.01); *C03B 19/06* (2013.01); *C03B 2201/62* (2013.01); *C03C 2214/04* (2013.01); *H01L 33/502* (2013.01); *H01L 51/5036* (2013.01)

(56) References Cited

FOREIGN PATENT DOCUMENTS

| | | |
|---|---|---|
| JP | 2012-158494 | 8/2012 |
| JP | 5712590 | 5/2015 |
| JP | 5750643 | 5/2015 |

OTHER PUBLICATIONS

Joo et al., "Fabrication of Remote Phosphor LED Using a Phosphor in Glass" The 66th Korean Physical Society Busan-Ulsan-Gyeongnam Branch Conference, Dec. 22, 2015, 12 pages.

* cited by examiner

[FIG. 1]
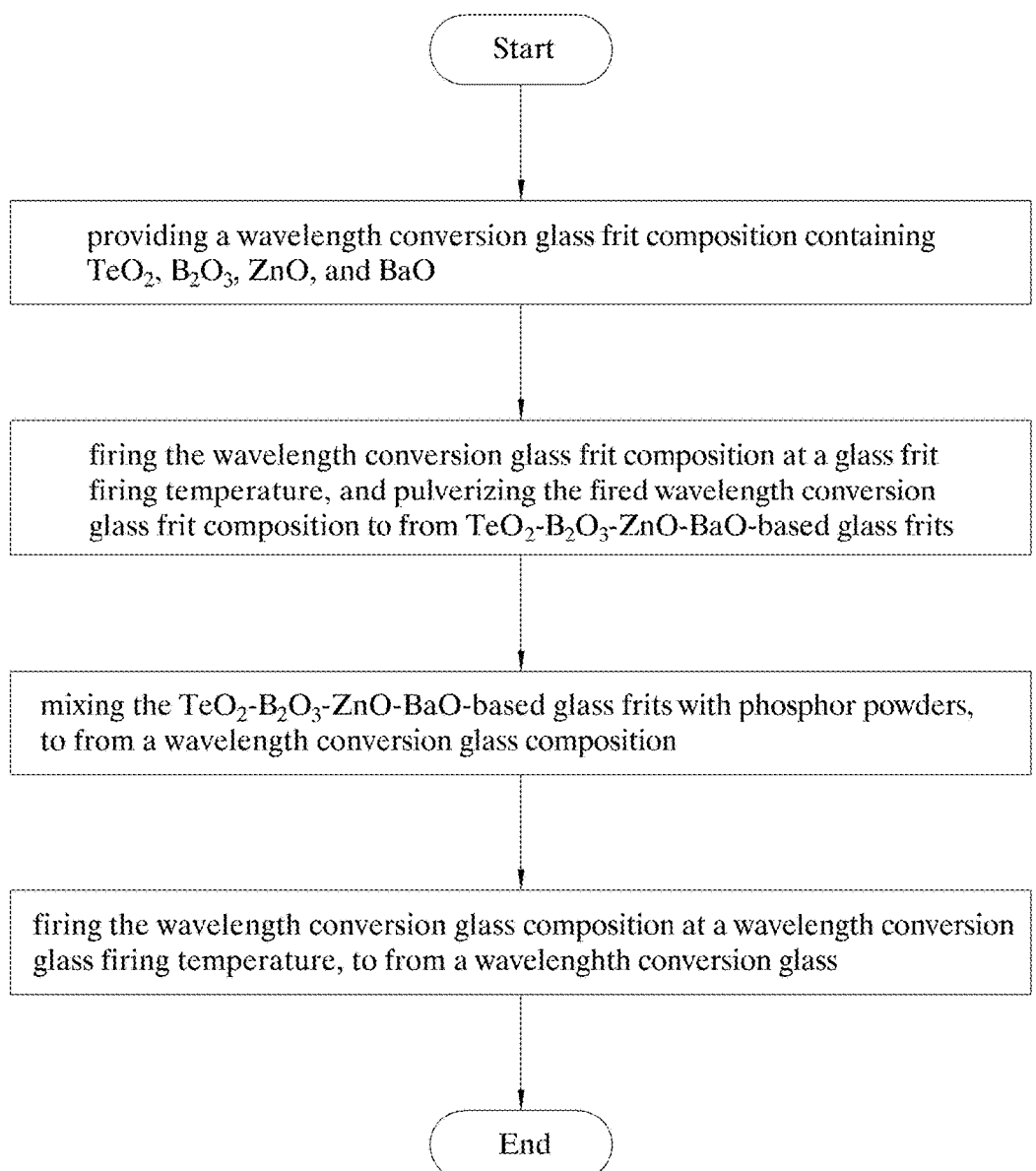

[FIG. 2]
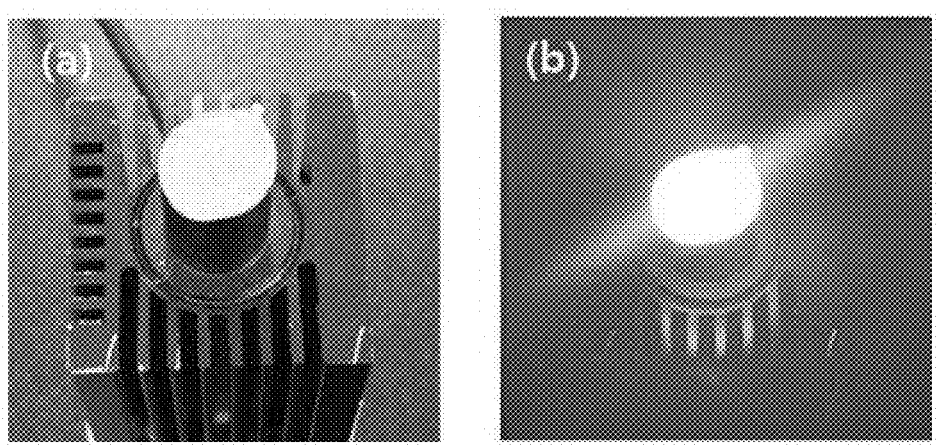

WAVELENGTH CONVERSION GLASS, METHOD FOR PREPARING SAME, AND LIGHT EMITTING DEVICE COMPRISING SAME

CROSS-REFERENCE TO RELATED APPLICATIONS

This application is a national phase under 35 U.S.C. § 371 of International Application No. PCT/KR2017/000160, filed Jan. 5, 2017, which claims the benefit of priority to Korean Patent Application Serial No. KR 10-2016-0016890, filed Feb. 15, 2016. The contents of each of the above-referenced applications are incorporated into the present application by reference.

TECHNICAL FIELD

The present disclosure relates to a wavelength conversion glass, a method for manufacturing the wavelength conversion glass, and a light emitting device including the wavelength conversion glass.

RELATED ART

A wavelength conversion material is fluorescently-emitted using a light that is irradiated thereon, thereby converting a wavelength. The wavelength conversion material is used in various fields, especially for color rendering by light emitting diodes emitting monochromatic light in a narrow wavelength range. The light emitting diode may render a mixed color between light corresponding to the wavelength converted by the wavelength conversion material and the light corresponding to the non-converted wavelength. The wavelength conversion material includes phosphor, semiconductor, and dye, among which, the phosphor is the most commonly used.

The phosphor emits fluorescence when light or radiation enters the phosphor. The phosphor may include silicate-based, garnet-based, and nitride-based phosphors. The phosphor may be generally carried in synthetic organic materials or ceramic materials in which the phosphor may be used as the wavelength conversion material. Particularly, many researches on phosphor-in-glass (PIG) using a glass as the carrier have been conducted.

However, the conventional PIG has a thickness of 1 mm or less and is very thin, and thus used in a form of a thin plate, and exhibits a low transmittance. For this reason, the conventional phosphor-in-glass (PIG) has a disadvantage that the color changes or deteriorates due to factors such as heat and light from a light source when the PIG is used for a long time. In addition, this reduces the lifetime of the phosphor-in-glass (PIG). Further, there is a problem that the PIG may not be used as a wavelength conversion component for a high output light source.

Therefore, it is necessary to develop a wavelength conversion glass that exhibits high transmittance and excellent thermal stability.

DISCLOSURE OF PRESENT DISCLOSURE

Technical Purposes

A purpose of the present disclosure is to provide a wavelength conversion glass exhibiting high transmittance, excellent thermal stability, and wavelength conversion efficiency.

Another purpose of the present disclosure is to provide a method for manufacturing the wavelength conversion glass.

Still another purpose of the present disclosure is to provide a light emitting device including the wavelength conversion glass.

Technical Solutions

In one aspect of the present disclosure, there is provided a wavelength conversion glass comprising: $TeO_2$—$B_2O_3$—ZnO—BaO-based transparent glass containing tellurium dioxide ($TeO_2$), boric oxide ($B_2O_3$), zinc oxide (ZnO), and barium oxide (BaO); and phosphor micro-particles dispersed in the transparent glass.

In one embodiment of the wavelength conversion glass, the $TeO_2$—$B_2O_3$—ZnO—BaO-based transparent glass contains $TeO_2$ 15 to 40 mol %, $B_2O_3$ 20 to 45 mol %, ZnO 10 to 20 mol %, and BaO 5 to 20 mol %.

In one embodiment of the wavelength conversion glass, each of phosphor micro-particles includes at least one selected from a group consisting of yttrium aluminum garnet (YAG) phosphor, garnet-based phosphor, silicate-based phosphor, sulfide-based phosphor, nitride-based phosphor, oxide-based phosphor, and fluoride-based phosphor.

In one embodiment of the wavelength conversion glass, each of phosphor micro-particles includes yttrium aluminum garnet having cerium doped therein (YAG:Ce).

In one embodiment of the wavelength conversion glass, the $TeO_2$—$B_2O_3$—ZnO—BaO-based transparent glass includes $TeO_2$, $B_2O_3$, ZnO, and BaO.

In another aspect of the present disclosure, there is provided a method for producing a wavelength conversion glass, the method comprising: providing a wavelength conversion glass frit composition containing $TeO_2$, $B_2O_3$, ZnO, and BaO; firing the wavelength conversion glass frit composition at a glass frit firing temperature; pulverizing the fired wavelength conversion glass frit composition to form $TeO_2$—$B_2O_3$—ZnO—BaO-based glass frits; mixing the $TeO_2$—$B_2O_3$—ZnO—BaO-based glass frits with phosphor powders, to form a wavelength conversion glass composition; and firing the wavelength conversion glass composition at a wavelength conversion glass firing temperature, to form a wavelength conversion glass, wherein the wavelength conversion glass has phosphor micro-particles dispersed therein.

In one embodiment of the method, the wavelength conversion glass firing temperature is lower than the glass frit firing temperature.

In one embodiment of the method, the glass frit firing temperature is higher than or equal to 1000° C., wherein the wavelength conversion glass firing temperature is lower than or equal to 800° C.

In one embodiment of the method, each of the phosphor powders includes at least one selected from a group consisting of yttrium aluminum garnet (YAG) phosphor, garnet-based phosphor, silicate-based phosphor, sulfide-based phosphor, nitride-based phosphor, oxide-based phosphor, and fluoride-based phosphor.

In one embodiment of the method, each of the phosphor powders includes yttrium aluminum garnet having cerium doped therein (YAG:Ce).

In one embodiment of the method, the wavelength conversion glass frit composition contains $TeO_2$ 15 to 40 mol %, $B_2O_3$ 20 to 45 mol %, ZnO 10 to 20 mol %, and BaO 5 to 20 mol %.

In still another aspect of the present disclosure, there is provided a light emitting device comprising: a light source;

and the wavelength conversion glass as defined above, wherein the wavelength conversion glass is configured to receive light from the light source and to convert a wavelength of the light.

In one embodiment of the light emitting device, the light source includes at least one of a light emitting diode (LED), an organic light emitting diode (OLED), a laser diode (LD), and a laser.

Advantageous Effects

In accordance with the wavelength conversion glass, the method for manufacturing the wavelength conversion glass, and the light emitting device including the wavelength conversion glass as defined above, the phosphor micro-particles may be dispersed in the transparent glass. This results in the wavelength conversion glass with superior fluorescent emission. Further, in the wavelength conversion glass according to the present disclosure, the phosphor may be carried in the glass as a carrier. As a result, a crystal structure of the phosphor is easily controlled, thereby exhibiting excellent thermal stability. Thus, the phosphor may be not deformed even in a high temperature environment, and, hence, the wavelength conversion glass may maintain high transparency. Further, the wavelength conversion glass according to the present disclosure may be used as a wavelength conversion component for high power light sources. As a result, a light emitting device including the wavelength conversion glass may be realized. Furthermore, using the method for producing the wavelength conversion glass according to the present disclosure, a production process of the wavelength conversion glass is easy, thereby providing the wavelength conversion glass economically.

BRIEF DESCRIPTION OF THE DRAWINGS

FIG. 1 is a view for illustrating a method of manufacturing a wavelength conversion glass in accordance with the present disclosure.

FIG. 2 is a view for illustrating a wavelength conversion glass according to an embodiment of the present disclosure.

DETAILED DESCRIPTION

Hereinafter, an embodiment of the present disclosure will now be described in detail with reference to the accompanying drawings. Since various modifications may be applied to the present disclosure and the present disclosure may have several embodiments, particular embodiments will be illustrated in the drawings and described. However, it will be understood that the description herein is not intended to limit the claims to the specific embodiments described, on the contrary, it is intended to cover alternatives, modifications, and equivalents as may be included within the spirit and scope of the present disclosure as defined by the appended claims. The same or similar reference numerals are used throughout the drawings and the description in order to refer to the same or similar constituent elements. In the accompanying drawings, the dimensions of the structure show an enlarged scale than actual for clarity of the disclosure.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A wavelength conversion glass in accordance with the present disclosure includes a $TeO_2$—$B_2O_3$—$ZnO$—$BaO$-based transparent glass containing tellurium dioxide ($TeO_2$), boric oxide ($B_2O_3$), zinc oxide ($ZnO$), and barium oxide ($BaO$); and phosphor micro-particles dispersed in the transparent glass.

The glass is an amorphous solid material with a high transparency. The glass may generally mean an object of a high transparency which may be formed by melting a glass composition at a high temperature and then cooling or firing the melt glass composition. The wavelength conversion glass according to the present disclosure may be used herein interchangeably with a phosphor-containing glass, a phosphor-carrying glass and a phosphor-in-glass (PIG).

The $TeO_2$—$B_2O_3$—$ZnO$—$BaO$-based transparent glass or wavelength conversion glass may contain $TeO_2$ 15 to 40 mol %, $B_2O_3$ 20 to 45 mol %, $ZnO$ 10 to 20 mol %, and $BaO$ 5 to 20 mol %.

The wavelength conversion glass may contain $TeO_2$, $B_2O_3$, $ZnO$, and $BaO$. In this connection, $TeO_2$, $B_2O_3$, $ZnO$, and $BaO$ may constitute the $TeO_2$—$B_2O_3$—$ZnO$—$BaO$-based transparent glass which has an excellent thermal stability.

Specifically, the wavelength conversion glass may be excellent in heat resistance. Thus, the glass may not be easily deformed by heat even at a high temperature. Further, the present wavelength conversion glass has good heat dissipation. For this reason, even when the wavelength conversion glass is exposed to a high-power light source for a long time, the phosphor dispersed in the wavelength conversion glass or the wavelength conversion glass may not be easily deformed or discolored, thereby exhibiting excellent fluorescence emission characteristics. That is, the present wavelength conversion glass may exhibit excellent wavelength conversion efficiency.

The wavelength conversion glass may further contain at least one of $Ta_2O_5$, $Nb_2O_5$, $Al_2O_3$, $ZrO_2$, $Ta_2O_3$, $Y_2O_3$, $WO_3$, $CeO_2$, $In_2O_3$, $ZnO$, $MgO$, $CaO$, and $SrO$ when appropriate. In this connection, a content of the least one of $Ta_2O_5$, $Nb_2O_5$, $Al_2O_3$, $Na_2O$, $Li_2O$, $K_2O$, $La_2O_3$, $ZrO_2$, $Ta_2O_3$, $Y_2O_3$, $WO_3$, $CeO_2$, $In_2O_3$, $ZnO$, $MgO$, $CaO$, and $SrO$ may be in a range of 0 exclusive to 15 mol % inclusive. Alternatively, the wavelength conversion glass in accordance with the present disclosure includes a $TeO_2$—$B_2O_3$—$ZnO$—$BaO$-based transparent glass containing $TeO_2$, $B_2O_3$, $ZnO$, and $BaO$; and phosphor micro-particles dispersed in the transparent glass.

The phosphor is a material that converts absorbed energy thereto into light. Atoms and molecules constituting the phosphor are excited into an electron-excited state to emit fluorescence.

In one embodiment, each of phosphor micro-particles includes at least one selected from a group consisting of yttrium aluminum garnet (YAG) phosphor, garnet-based phosphor, silicate-based phosphor, sulfide-based phosphor, nitride-based phosphor, oxide-based phosphor, and fluoride-based phosphor.

In one example, the phosphor may be YAG-based phosphor. Specifically, each of the phosphor micro-particles includes yttrium aluminum garnet (YAG) having cerium (Ce) doped therein (YAG:Ce). YAG is may be a double oxide ($Y_2Al_5O_{12}$) of yttrium oxide ($Y_2O_3$) and aluminum oxide ($Al_2O_3$). The YAG:Ce phosphor may refer to a YAG phosphor doped with cerium as a rare earth element.

The wavelength conversion glass in accordance with the present disclosure has the phosphor micro-particles dispersed in the transparent glass. In this connection, the phosphors may be partially dissolved in the transparent glass. Specifically, in the wavelength conversion glass, some of the phosphors may be dissolved in the transparent glass, while the other of the phosphors may be dispersed in the glass in the form of microparticles.

Further, since in the wavelength conversion glass, some of the phosphors are dissolved in the transparent glass, while the other of the phosphors are dispersed in the glass in the form of microparticles, the wavelength conversion glass may be maintained to have a light transparency and may exhibit the high transmittance. As a result, the wavelength conversion glass having an increased thickness may be provided. For example, the present wavelength conversion glass may be 2 mm thick. The present wavelength conversion glass may exhibit excellent fluorescence efficiency and high transmittance even at the thickness of 2 mm thereof.

Further, the wavelength conversion glass in accordance with the present disclosure may have the excellent thermal stability, wavelength conversion efficiency, and high transmittance, as described above, and thus may be applied as a wavelength change component for a light emitting device including a high-power light source. The light emitting device including the wavelength conversion glass will be described in more detail below.

Hereinafter, a method for manufacturing the wavelength conversion glass according to the present disclosure will be described with reference to FIG. 1.

FIG. 1 is a flow diagram for illustrating a method for manufacturing the wavelength conversion glass in accordance with the present invention.

Referring to FIG. 1, a method for manufacturing the wavelength conversion glass in accordance with the present invention may include providing a wavelength conversion glass frit composition containing $TeO_2$, $B_2O_3$, ZnO, and BaO (S110).

In this connection, the wavelength conversion glass frit composition contains $TeO_2$ 15 to 40 mol %, $B_2O_3$ 20 to 45 mol %, ZnO 10 to 20 mol %, and BaO 5 to 20 mol %.

Then, the method for manufacturing the wavelength conversion glass in accordance with the present invention may include firing the wavelength conversion glass frit composition at a glass frit firing temperature, and include pulverizing the fired wavelength conversion glass frit composition to form $TeO_2$—$B_2O_3$—ZnO—BaO-based glass frits (S120).

The glass frits generally may refer to the glass powders. The $TeO_2$—$B_2O_3$—ZnO—BaO-based glass frits may refer to glass frits containing $TeO_2$, $B_2O_3$, ZnO, and BaO.

The glass frit firing temperature refers to a temperature at which the components of the glass composition may be homogeneously melted and then fired to form the glass frits. For example, the wavelength conversion glass frit composition including $TeO_2$, $B_2O_3$, ZnO, and BaO may be fired at a temperature equal to or higher than 1000° C.

Thereafter, the method for manufacturing the wavelength conversion glass in accordance with the present invention may include mixing the $TeO_2$—$B_2O_3$—ZnO—BaO-based glass frits with phosphor powders, to form a wavelength conversion glass composition (S130). Then, the method for manufacturing the wavelength conversion glass in accordance with the present invention may include firing the wavelength conversion glass composition at a wavelength conversion glass firing temperature, to form a wavelength conversion glass, wherein the wavelength conversion glass has phosphor micro-particles dispersed therein (S140).

In this connection, each of phosphor powders includes at least one selected from a group consisting of yttrium aluminum garnet (YAG) phosphor, garnet-based phosphor, silicate-based phosphor, sulfide-based phosphor, nitride-based phosphor, oxide-based phosphor, and fluoride-based phosphor. In one example, the phosphor may be YAG-based phosphor. Specifically, each of the phosphor micro-particles includes yttrium aluminum garnet (YAG) having cerium (Ce) doped therein (YAG:Ce). YAG is may be a double oxide ($Y_2Al_5O_{12}$) of yttrium oxide ($Y_2O_3$) and aluminum oxide ($Al_2O_3$). YAG:Ce phosphor may refer to a YAG phosphor doped with cerium as a rare earth element.

The wavelength conversion glass firing temperature refers to a firing temperature at which the wavelength conversion glass composition may be fired such that the phosphor powders may be dispersed in the form of microparticles in the transparent glass. The wavelength conversion glass firing temperature may be lower than the glass frit firing temperature. For example, the wavelength conversion glass firing temperature may be lower by at least 100° C. than the glass frit firing temperature.

Specifically, the glass frits formed by firing the wavelength conversion glass frit composition at the glass frit temperature may be uniformly melted at a temperature lower than the temperature at which the wavelength conversion glass frit composition is fired. That is, a melting point of the glass frits may be lowered. For this reason, the wavelength conversion glass firing temperature may be lower than the glass frit firing temperature.

In one example, when the wavelength conversion glass frit composition contains $TeO_2$, $B_2O_3$, ZnO, and BaO, and the phosphors include YAG:Ce, the glass frit firing temperature for the wavelength conversion glass frit composition including $TeO_2$, $B_2O_3$, ZnO, and BaO may be higher than or equal to 1000° C., while the wavelength conversion glass firing temperature for the wavelength conversion glass composition containing the mixture of the glass frits and phosphor powders may be lower than or equal to 800° C.

When the phosphor is exposed to high temperatures, the crystal structure of the phosphor may be deformed. Therefore, when the wavelength conversion glass composition containing phosphors is fired at a high temperature, the fluorescent light-emitting property may be lost due to the crystal structure modification of the phosphor. The changes in the crystal structure of the phosphor may change the color of the wavelength conversion glass. Specifically, when the wavelength conversion glass containing phosphors is fired at a high temperature such as the glass frit firing temperature, all of the phosphors are completely dissolved in the glass due to the crystal structure change of the phosphors. As a result, the color of the wavelength conversion glass changes to the color of the phosphor. Thus, the transparency of the glass may be reduced. In addition, due to the reduction of the transparency of the wavelength conversion glass, light that is not transmitted through the wavelength conversion glass becomes a heat source therein, and, thus, the crystal structure of the phosphor may be further modified due to the heat source. Therefore, when the wavelength conversion glass containing phosphors is fired at a high temperature, the light transmittance and fluorescence emission characteristics of the resulting glass may be reduced. As a result, the wavelength conversion glass including phosphors may not be used for a long time.

However, in the wavelength conversion glass in accordance with the present disclosure, the wavelength conversion glass firing temperature may be lower than the glass frit firing temperature. This makes it possible to achieve the wavelength conversion glass in which the phosphors are dispersed uniformly in the form of microparticles in the resulting glass. In this connection, the phosphors may be partially dissolved in the transparent glass. Specifically, in the wavelength conversion glass, some of the phosphors may be dissolved in the transparent glass, while the other of the phosphors may be dispersed in the glass in the form of microparticles.

Thus, according to the method for producing the present wavelength conversion glass in accordance with the present disclosure, the crystal structure of some phosphors is not deformed and said some phosphors are dispersed in the form of microparticles. Thus, the resulting glass may exhibit excellent fluorescence efficiency without loss of fluorescence emission characteristics. In other words, the wavelength conversion glass may exhibit excellent wavelength conversion efficiency. Further, since all of the phosphors does not completely dissolve in the glass, but some thereof are dispersed in the form of microparticles, the wavelength conversion glass may exhibit high transmittance.

Hereinafter, with reference to FIG. 2, there is illustrated an example in which the wavelength conversion glass in accordance with the present disclosure includes $TeO_2$, $B_2O_3$, ZnO, BaO, and YAG:Ce. Thus, fluorescent emission characteristics of the wavelength conversion glass according to the present disclosure will be described generally with reference to this example.

To fabricate the wavelength conversion glass according to the example of the present disclosure, first, $TeO_2$, $B_2O_3$, ZnO, and BaO are prepared by 30, 40, 20, and 10 mol % respectively and then are mixed with each other. Thus, a wavelength conversion glass frit composition is prepared. The wavelength conversion glass frit composition is then melted at 1000° C. and then cooled. The cooled wavelength conversion glass frit composition is powdered to form glass frits. The glass frits thus formed are mixed with YAG:Ce phosphor powders to prepare a wavelength conversion glass composition. The glass composition is then fired at 800° C. to produce a wavelength conversion glass according to this example of the present disclosure.

FIG. 2 is an illustration of the wavelength conversion glass according to the above example of the present disclosure.

FIG. 2(a) shows the wavelength conversion glass before light irradiation thereto. FIG. 2(b) shows the wavelength conversion glass after light irradiation thereto.

As shown in FIG. 2, the wavelength conversion glass in accordance with the present disclosure exhibits excellent transmittance. When irradiating a light source onto the wavelength conversion glass, the wavelength conversion glass exhibits excellent fluorescence emission characteristics. In other words, it may be confirmed that the wavelength conversion glass according to the present disclosure exhibits excellent wavelength conversion efficiency. This is because of the following reason: in the wavelength conversion glass according to the present disclosure, some of the phosphors are dispersed in the form of microparticles without changing the crystal structure thereof in the wavelength conversion glass.

Thus, it is confirmed that the wavelength conversion glass in accordance with the present disclosure has the phosphors dispersed therein in the form of microparticles, thereby exhibiting excellent wavelength conversion efficiency and transmittance.

As described above, according to the method for producing the present wavelength conversion glass according to the present disclosure, the wavelength conversion glass exhibiting the excellent thermal stability, wavelength conversion efficiency, and transmittance may be provided. Due to these good characteristics, the wavelength conversion glass may be applied as a wavelength conversion component for high power and high temperature light sources.

The light emitting device according to the present disclosure includes the above light source, and at least one of the wavelength conversion glasses as defined above. The wavelength conversion glass receives light emitted from the light source of the light emitting device and converts the wavelength of the light.

In one embodiment, the light emitting device according to the present disclosure includes at least one of a light emitting diode (LED), an organic light emitting diode (OLED), and a laser diode (LD). In this connection, the wavelength conversion glass may be applied as a wavelength conversion element for the diode.

Alternatively, the diode device may be configured as a light source for the light emitting device. Specifically, the light source for the light emitting device may include a light emitting diode, an organic light emitting diode, a laser diode, a laser, and the like.

The wavelength conversion glass exhibits excellent thermal stability, wavelength conversion efficiency, and transmittance. As a result, when the wavelength conversion glass is exposed to the high-power light source for a long time, the wavelength conversion glass is not easily discolored and deformed, and thus, maintains excellent fluorescence emission characteristics. As a result, the wavelength conversion glass may be applied as a wavelength conversion element for a light source or a light emitting device for a high output light emitting diode or a laser diode.

Although the present disclosure has been described with reference to preferred embodiments, workers skilled in the art will recognize that changes may be made in form and detail without departing from the spirit and scope of the present disclosure.

What is claimed is:

1. A method for producing a wavelength conversion glass, the method comprising:
    providing a wavelength conversion glass frit composition containing $TeO_2$, $B_2O_3$, ZnO, and BaO;
    firing the wavelength conversion glass frit composition at a glass frit firing temperature;
    pulverizing the fired wavelength conversion glass frit composition to form $TeO_2$—$B_2O_3$—ZnO—BaO-based glass frits;
    mixing the $TeO_2$—$B_2O_3$—ZnO—BaO-based glass fits with phosphor powders, to form a wavelength conversion glass composition; and
    firing the wavelength conversion glass composition at a wavelength conversion glass firing temperature, to form a wavelength conversion glass, wherein the wavelength conversion glass has phosphor micro-particles dispersed therein, and wherein the wavelength conversion glass firing temperature is lower than the glass frit firing temperature.

2. The method of claim 1, wherein the glass frit firing temperature is higher than or equal to 1000° C., wherein the wavelength conversion glass firing temperature is lower than or equal to 800° C.

3. The method of claim 1, wherein each of the phosphor powders includes at least one selected from a group consisting of yttrium aluminum garnet (YAG) phosphor, garnet-based phosphor, silicate-based phosphor, sulfide-based phosphor, nitride-based phosphor, oxide-based phosphor, and fluoride-based phosphor.

4. The method of claim 3, wherein each of the phosphor powders includes yttrium aluminum garnet having cerium doped therein (YAG:Ce).

5. The method of claim 1, wherein the wavelength conversion glass frit composition contains $TeO_2$ 15 to 40 mol %, $B_2O_3$ 20 to 45 mol %, ZnO 10 to 20 mol %, and BaO 5 to 20 mol %.

* * * * *